(12) United States Patent
Oprescu

(10) Patent No.: US 7,348,907 B2
(45) Date of Patent: Mar. 25, 2008

(54) RANGE COMPRESSION IN OVERSAMPLING ANALOG-TO-DIGITAL CONVERTERS

(75) Inventor: Florin A. Oprescu, Rancho Santa Fe, CA (US)

(73) Assignee: Linear Technology Corp., Milpitas, CA (US)

( * ) Notice: Subject to any disclaimer, the term of this patent is extended or adjusted under 35 U.S.C. 154(b) by 0 days.

(21) Appl. No.: 11/483,420

(22) Filed: Jul. 7, 2006

(65) Prior Publication Data
US 2008/0007435 A1     Jan. 10, 2008

(51) Int. Cl.
*H03M 1/00*     (2006.01)
(52) U.S. Cl. .................. 341/139; 341/120; 341/121
(58) Field of Classification Search ................ 341/118, 341/120, 143, 155, 161, 172
See application file for complete search history.

(56) References Cited

U.S. PATENT DOCUMENTS

| 5,490,130 | A | * | 2/1996 | Akagiri ................ 369/124.08 |
| 5,539,202 | A | * | 7/1996 | Geagan et al. ............ 250/369 |
| 5,706,352 | A | * | 1/1998 | Engebretson et al. ....... 381/312 |
| 5,832,444 | A | * | 11/1998 | Schmidt ..................... 704/500 |
| 6,097,824 | A | * | 8/2000 | Lindemann et al. ........ 381/315 |
| 6,140,950 | A | | 10/2000 | Oprescu |
| 6,169,506 | B1 | | 1/2001 | Oprescu |
| 6,493,657 | B1 | * | 12/2002 | Godfrey et al. ............. 702/198 |
| 2003/0151532 | A1 | * | 8/2003 | Chen et al. .................. 341/120 |
| 2006/0089813 | A1 | * | 4/2006 | Mushirahad et al. .......... 702/39 |
| 2006/0222118 | A1 | * | 10/2006 | Murthy et al. .............. 375/345 |

OTHER PUBLICATIONS

Benjamin, O.J. and Candy, J.C., "The Structure of Quantization Noise from Sigma-Delta Modulation," IEEE Trans. Commun., Sep. 1981, pp. 1316-1323, vol. COM-29.
Ritoniemi, T.; Karema, T.; and Tenhunen, H.; "Design of Stable High Order 1-bit Sigma-Delta Modulators", IEEE Proc. ISCAS'90, May 1990, pp. 3267-3270.
"24-Bit µPower No Latency ΔΣ™ ADC in SO-8," LTC2400 Data Sheet, *Linear Technology Corporation*, 1998.
"24-Bit No Latency ΔΣ™ ADC with Differential Input and Differential Reference," LTC2410 Data Sheet, *Linear Technology Corporation*, 2000.

* cited by examiner

*Primary Examiner*—Linh Nguyen
(74) *Attorney, Agent, or Firm*—McDermott Will & Emery LLP

(57) ABSTRACT

An analog-to-digital converter according to the invention is provided. The analog-to-digital converter preferably includes an analog input signal, a first reference signal, a second reference signal, and a range compression signal. The range compression signal is preferably characterized by a magnitude greater than the first reference signal and smaller than the second reference signal. In addition, when the analog input signal is sampled N times and the range compression signal is sampled N1 times, a compression factor that is based at least in part on N1/(N+N1) is obtained.

38 Claims, 5 Drawing Sheets

RANGE COMPRESSION IN OVERSAMPLING ANALOG-TO-DIGITAL CONVERTERS

CROSS-REFERENCE TO RELATED APPLICATION

This application claims priority from commonly-assigned U.S. patent application Ser. No. 11/483,390, filed on Jul. 6, 2006, entitled "RANGE COMPRESSION IN OVERSAMPLING ANALOG-TO-DIGITAL CONVERTERS USING DIFFERENTIAL INPUT SIGNALS" which is incorporated herein by reference in its entirety.

BACKGROUND OF THE INVENTION

The input signal range of an Analog-to-Digital converter (ADC) extends between a minimum value (further referred to as the "input range lower limit" LL) and a maximum value (further referred to as the "input range upper limit" UL). As an example, in a unipolar ADC the LL usually represents the zero scale point and the UL usually describes the full-scale point. In a bipolar ADC the LL is usually the "minus full scale" point while the UL is usually the "plus full scale" point.

In the description that follows herein, the end points of the ADC external input range—i.e., the end points of the range of the analog signal transmitted to the ADC—will be referred to as LL and UL while the end points of the ADC internal input range—i.e., the end points of the range of signals that the ADC is able to process—will be referred to as $LL_I$ and $UL_I$. When an external signal of value LL is applied at the ADC input the expected ideal conversion result is referred to as code(LL). Similarly, when an external signal UL is applied to the ADC input the expected ideal conversion result is referred to as code(UL).

Three distinct problems are present in ADCs. The first two problems are specific to oversampling converters.

First, the quantization noise of an oversampling ADC varies with the input signal and is substantially higher in the vicinity of the internal input range end points $LL_I$ and $UL_I$. This behavior is described in detail in the paper "The Structure of Quantization Noise from Sigma-Delta Modulation" by J. C. Candy and O. J. Benjamin published in IEEE Trans. Commun., vol. COM-29, pp. 1316-1323, September 1981. It is thus highly desirable to prevent the ADC operation in these regions.

Second, as the order of the modulator contained within the oversampling ADC increases, a series of stability issues arise which limit the effective range of the ADC to substantially less than the full input range. This issue is further described in the paper "Design of Stable High Order 1-bit Sigma-Delta Modulators" by T. Ritoniemi, T, Karema and H. Tenhunen published in IEEE Proc. ISCAS'90, pp. 3267-3270, May 1990. Therefore it is often necessary to operate the ADC away from the internal input range limit points $LL_I$ and $UL_I$.

Third, the LL and UL values are in general easily available external signals like "ground" or Vref (reference voltage) or—Vref and are commonly used in evaluating and calibrating the ADC offset and gain errors. When these values are applied to the ADC input, the presence of internal ADC error sources (like gain or/and offset error) may result in a combined equivalent value outside of the ADC internal input signal range $LL_I$-to-$UL_I$. In this situation the conversion produces an "out of range" result. When an out of range result is obtained, the ADC output cannot be calibrated using this result. This is because the result does not contain sufficient meaningful information. Therefore it is highly desirable to use an ADC with an internal range $LL_I$-to-$UL_I$ wider than the external range LL-to-UL.

In addition, it is important from a user point of view for the ADC to produce its minimum output code for the LL external input signal and its maximum output code for the UL external input signal. Thus any range modification and restriction that is introduced in order to solve the above mentioned issues should be transparent to the ADC user.

THE PRIOR ART

These problems have been previously solved by using an ADC with a substantially larger internal input range than the specified external input range. As an example Linear Technology analog-to-digital converter LTC2410 has a specified external input range extending from LL=−Vref/2 to UL=+Vref/2. This converter utilized an ADC engine with a much larger internal input range extending from $LL_I$=−Vref to $UL_I$=+Vref.

A second example is the Linear Technology analog-to-digital converter LTC2400 with a specified external input range extending from LL=−Vref/12 to UL=13/12*Vref. The ADC engine has a much larger internal input range between LLI=−Vref/2 and ULI=3/2*Vref.

For both of these examples, because the relation between the external and internal input ranges can be expressed as an exact binary ratio the digital output result which appears in a binary format can be obtained by direct truncation of the conversion engine result.

A graphical representation of the relations between the external input range, the internal input range and the output range are shown in FIG. 1.

The maximum external input signal range LL-UL is mapped into an internal input range LL'-UL' which represents only a fraction of the significantly larger maximum internal input range $LL_I$-$UL_I$ such that:

$$LL'=LL>LL_I \text{ and } UL'=UL<UL_I$$

The output maximum range code(UL)-code(LL) is obtained by direct truncation of the conversion engine output range.

This mapping should preferably be done with a great degree of repeatability and stability in order not to compromise the ADC overall specifications. The relation between the internal and external maximum input ranges is also dictated by the acceptable level of complexity required in the truncation algorithm. Thus it is usually the case that the internal maximum input range is an exact multiple of the external maximum input range.

This solution provides a 50% of full scale margin at both $LL_I$ and $UL_I$ ends of the internal input range which is typically more than required. For most practical situations, this type of solution is expensive from a performance point of view. In such solutions, the internal conversion engine should preferably be over-designed by a factor of 2.

SUMMARY OF THE INVENTION

A method of deriving a compressed operational range of an analog to digital converter from an input signal range of the analog to digital converter is provided. A relationship of the compressed operational range to the input signal range preferably depends on a compression factor.

The method according to the invention preferably includes sampling an analog input signal N times and sampling a range compression signal N1 times to obtain the compression factor that is based at least in part on N1/(N+N1).

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DESCRIPTION OF THE INVENTION

This invention proposes a more efficient solution to the three problems described above. It is quite often the case that these problems occur in a very narrow region near the $LL_I$ and $UL_I$ values. The size of the margins required to compensate for these problems at the $LL_I$ and $UL_I$ ends of the scale varies usually from a very small fraction of 1% to about 10% of full scale. For an optimal implementation it is thus desirable to be able to adjust the size of these margins with good resolution, repeatability and accuracy.

Figure 1:
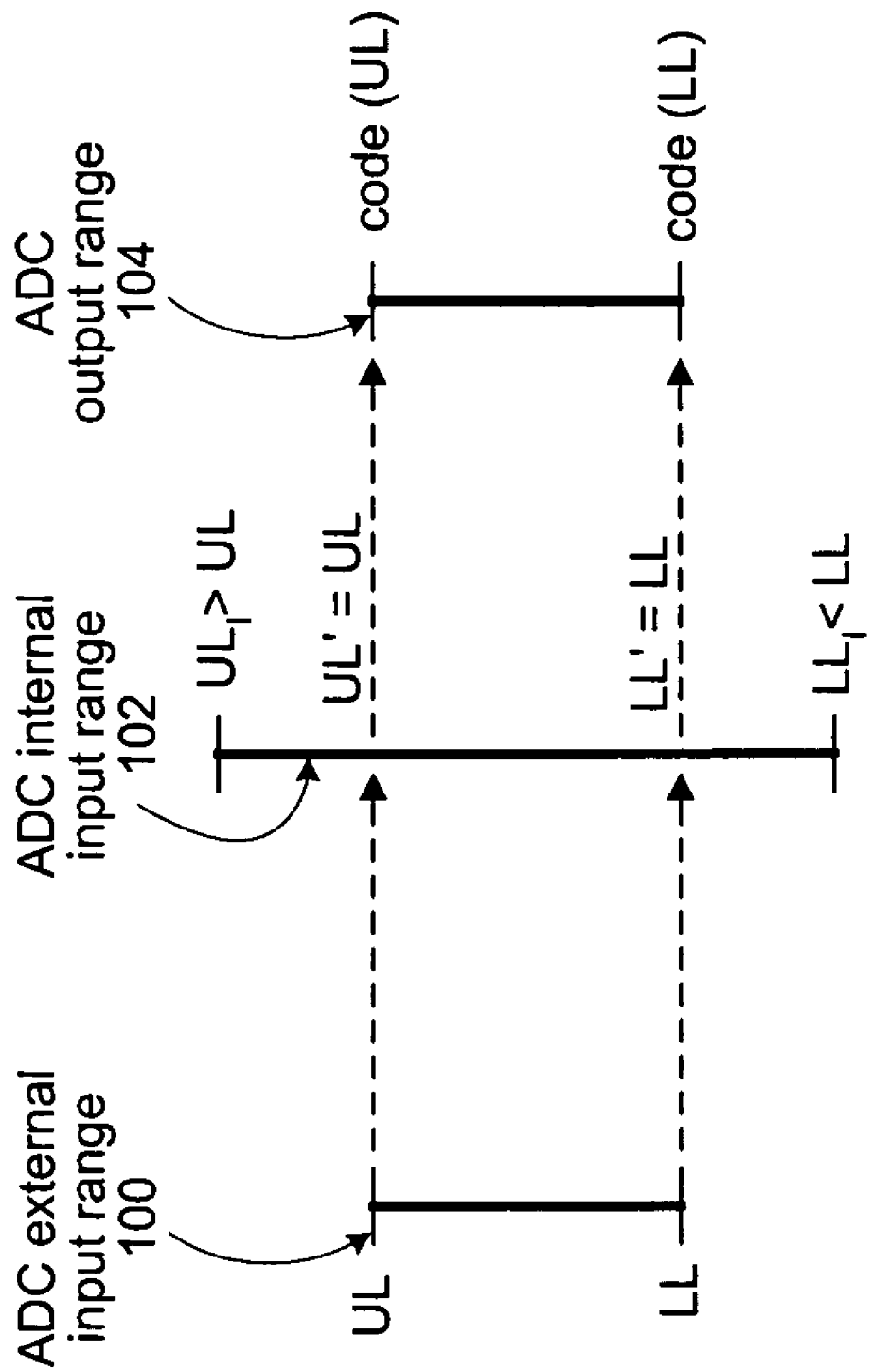
FIG. 1 is a diagram illustrating an embodiment of an external input range and an expanded internal input range of an analog-to-digital converter.
Figure 2:
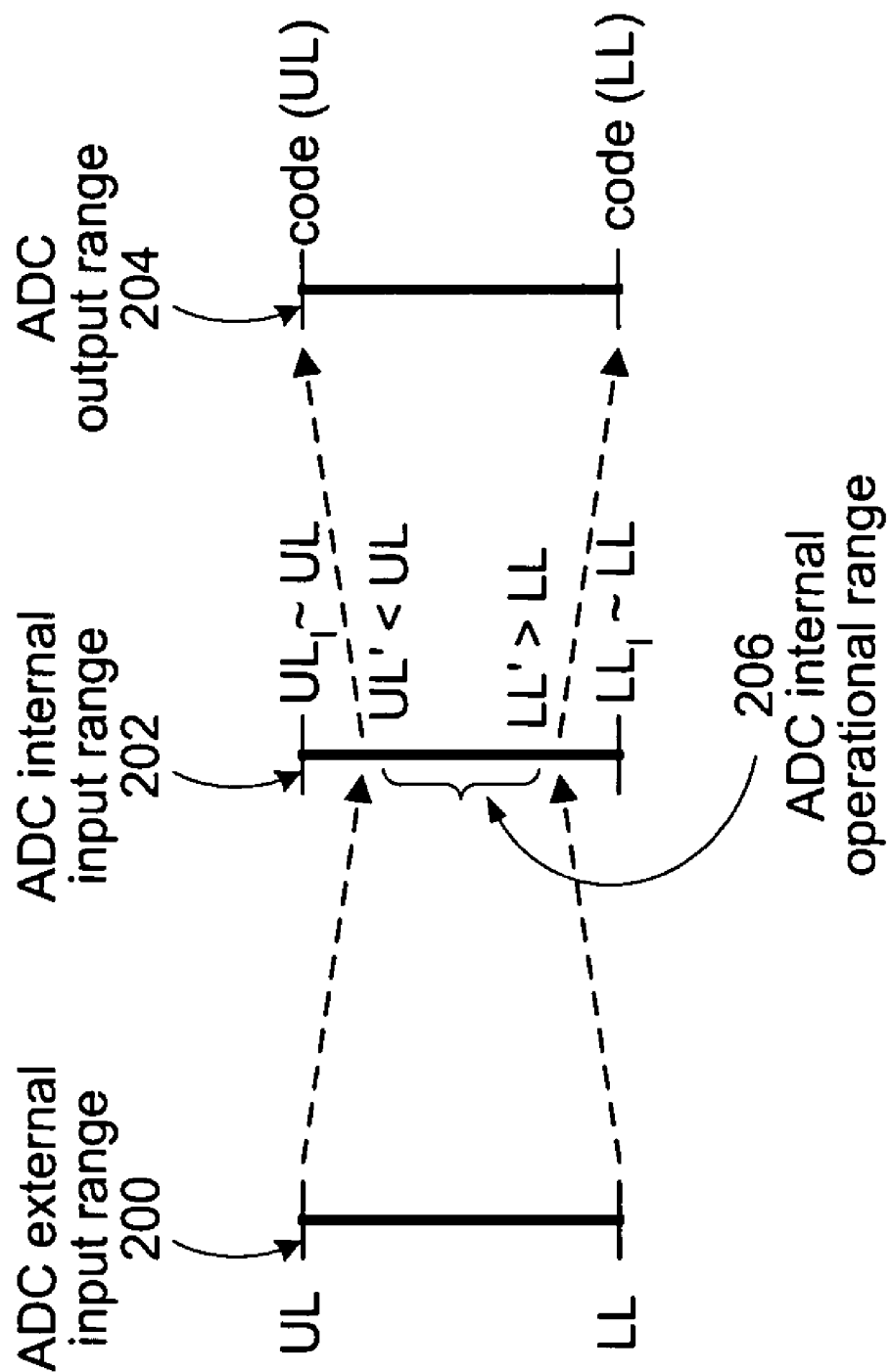
FIG. 2 is a diagram illustrating a conventional external input range, an internal input range, and a compressed operational range of an analog-to-digital converter.

A graphical representation of the proposed relations between the external input range 200, the internal input range 202 and the output range 204 are shown in FIG. 2. Furthermore, an operational range 206 that has been compressed from the internal input range is also shown.

The maximum external input signal range LL-UL is compressed into a slightly smaller magnitude operational internal input range LL'-UL' 206 located within the internal maximum input range $LL_I$-$UL_I$. In this configuration the maximum internal input range is approximately equal in size with the maximum external input range such that:

$$LL' > LL_I \approx LL \text{ and } UL' < UL_I \approx UL$$

The output maximum range code(LL)-code(UL) is obtained by expanding the conversion engine output range code(LL')-code(UL').

Because the internal and external maximum input ranges are of approximately equal size the ADC engine does not need to be over designed. Furthermore, the size of the margins maintained at the internal input range end points $LL_I$ and $UL_I$ can be precisely controlled by adjusting the input range compression ratio (LL-to-UL into LL'-to-UL') and its reciprocal—the output code expansion ratio (code (LL')-to-code(UL') into code(LL)-to-code(UL)).

Systems and methods according to the invention are applicable to an oversampling converter which operates by sampling and accumulating its input signal, $V_{IN}$, N times during a conversion cycle. Thus the average input signal per sample period is:

$$V_{AV} = N*V_{IN}/N = V_{IN}$$

The input range compression is preferably accomplished by adding N1 additional sampling steps to the conversion. During these additional steps the converter samples and accumulates a signal $V_{RC}$ instead of the input signal $V_{IN}$. Therefore the average input signal per sample period becomes:

$$V_{AV} = (N*V_{IN} + N1*V_{RC})/(N+N1) = V_{IN} + (V_{RC} - V_{IN})*N1/(N+N1)$$

When the LL value is applied at the input of such a converter the average input signal per sample period becomes:

$$LL' = LL + (V_{RC} - LL)*N1/(N+N1) > LL \text{ if } V_{RC} > LL$$

When the UL value is applied at the input of such a converter the average input signal per sample period becomes:

$$UL' = UL + (V_{RC} - UL)*N1/(N+N1) < UL \text{ if } V_{RC} < UL$$

From these relations it can be concluded that if the voltage $V_{RC}$ is chosen such that:

$$LL < V_{RC} < UL$$

the ADC external input range LL-to-UL is compressed into a reduced internal input range LL'-to-UL'. The margins available at the end scale points LL' and UL' can be independently controlled by choosing appropriate values for N1 and $V_{RC}$. For example, in order to establish equal margins at both ends of the internal range one can select:

$$V_{RC} = 0.5*(LL+UL).$$

In this situation:

$$LL' = LL + 0.5*(UL-LL)*N1/(N+N1)$$

$$UL' = UL - 0.5*(UL-LL)*N1/(N+N1)$$

If it is desirable to have equal margins of approximately 1% of full scale at both ends of the range, one will select N1=0.0204*N. The compressed input range thus becomes:

$$LL' = LL + 0.01*(UL-LL)$$

$$UL' = UL - 0.01*(UL-LL)$$

Sometimes, depending upon specific converter architecture and application, it is desirable to establish unequal margins at the two end points of the internal input range. For example, if the expected converter offset error is substantially lower than the expected gain error a margin of approximately 1% of full scale may be desirable at LL' while a margin of approximately 3% of full scale may be desirable at UL'. In these circumstances one can select:

$$V_{RC} = 0.75*LL + 0.25*UL$$

$$N1 = 0.0417*N$$

The compressed input range thus becomes:

$$LL' = LL + 0.25*(UL-LL)*N1/(N+N1) = LL + 0.01*(UL-LL)$$

$$UL' = UL + 0.75*(UL-LL)*N1/(N+N1) = LL + 0.03*(UL-LL)$$

From the above formulae it can be observed that the compression factor depends upon the variables $V_{RC}$ and N1 through the relation $(V_{RC} - V_{IN})*N1/(N+N1)$. As mentioned above it is highly desirable to use a compression factor with good resolution and very high accuracy and repeatability.

The compression factor resolution (through the ratio N1/(N+N1)) is directly dependent upon the oversampling ratio N and can be immediately improved by increasing this ratio.

Because the ratio N1/(N+N1) is preferably defined by digital control circuits, additional sources of inaccuracy are attributable solely to $V_{RC}$. It is therefore desirable to derive $V_{RC}$ directly from the converter input range limit values LL and UL through digital relationships in order to minimize or eliminate additional sources of error.

For example implementing, as suggested above, $V_{RC}=0.5*(LL+UL)$ can be done by sampling the LL external signal in half of the additional N1 sample periods and sampling the external UL signal in the remaining half. This would be particularly useful in a unipolar converter in which LL is usually ground and UL is usually the external reference voltage $V_{REF}$.

Figure 5:
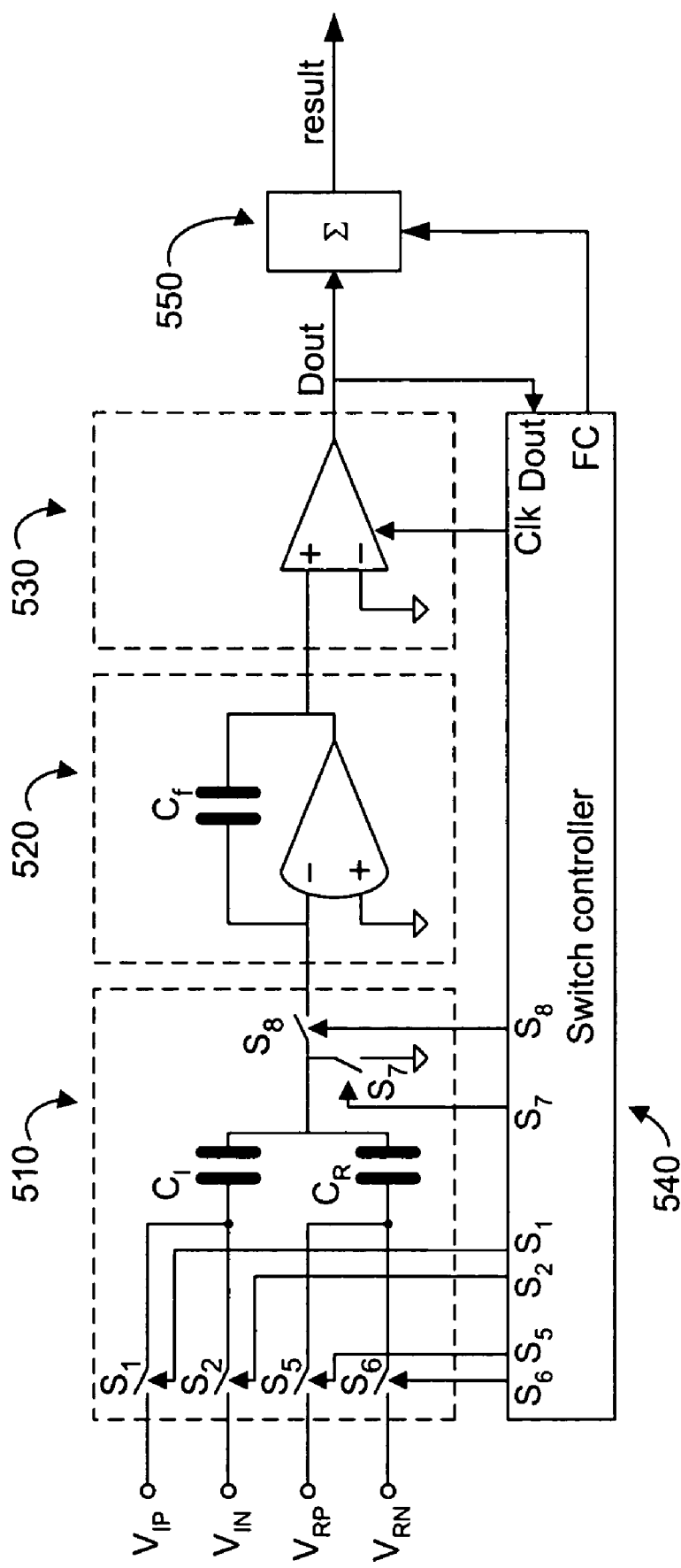
FIG. 5 is a diagram illustrating another analog-to-digital conversion arrangement according to the present invention.

For a bipolar converter defined such that $UL=V_{REF}$ and $LL=-V_{REF}$, the $V_{RC}$ value becomes zero and the range compression can be implemented by not sampling any voltage during the N1 additional periods (see FIG. 5 for such an example). An alternative implementation samples the $-V_{REF}$ external signal in half of the N1 periods and the $+V_{REF}$ external signal in the remaining half. A person skilled in the art will immediately recognize the noise advantage of the first implementation and the linearity advantage of the second implementation and will make the selection according with the specific application objectives.

When implementing $V_{RC}=0.75*LL+0.25*UL$ as suggested in the second example presented above, one can elect to sample the LL external signal in three quarters of the additional N1 periods and the UL external signal in remaining one quarter of N1.

These represent only examples of preferred implementations and do not limit the available options in producing the desired range compression.

In view of the foregoing, the minimum condition for implementing range compression is an over-sampled ADC using N sample periods and having an input range LL-to-UL. To this one preferably adds a range compression signal $V_{RC}$ sampled as input during N1 additional sample periods. For the range compression to occur it is preferably necessary to maintain $LL<V_{RC}<UL$. Alternatively, range compression can be obtained when the average $V_{RC}$ is between LL and UL.

It is further desirable to derive the $V_{RC}$ signal from the LL and UL values, preferable through digital controlled relations.

The result of the conversion process with an average input signal per sample period $V_{AV}$ and an N sample sequence is a number $N_R$ such that:

$$N_R=(V_{AV}/V_{REF})*N$$

Thus the output codes corresponding to the external input range LL-to-UL are:

$$code(LL)=(LL/V_{REF})*N$$

$$code(UL)=(UL/V_{REF})*N$$

When the number of sample periods becomes N+N1 the conversion result becomes:

$$NR=(V_{AV}/V_{REF})*(N+N1)$$

When, as described above, an external input voltage range LL-to-UL is compressed to an internal input range LL'-to-UL' in an N+N1 sample sequence the conversion results corresponding to the end points are:

$$code(LL')=(LL'/V_{REF})*(N+N1)$$

$$code(LL')=(LL/V_{REF})*(N+N1)+((V_{RC}-LL)/V_{REF})*N1$$

$$code(LL')=(LL/V_{REF})*N+(V_{RC}/V_{REF})*N1=code(LL)+(V_{RC}/V_{REF})*N1 \text{ and similarly}$$

$$code(UL')=(UL/V_{REF})*N+(V_{RC}/V_{REF})*N1=code(UL)+(V_{RC}/V_{REF})*N1$$

From these relations it is apparent that the output code expansion can be achieved by referencing the output results to the original N samples sequence and subtracting the pre-calculated constant digital offset (CDO) value:

$$CDO=(V_{RC}/V_{REF})*N1$$

In other words the necessary output code expansion occurs preferably automatically if N is selected equal to the full scale converter output (in counts) and an offset value $(V_{RC}/V_{REF})*N1$ is subtracted from the conversion result.

An important issue which should be considered when implementing the proposed range compression is the location of the additional N1 sample periods with respect to the original N sample periods.

The ADC equivalent input signal can be considered as a superposition of two distinct signals, an input signal and a range compression signal.

The input signal is the original input signal $V_{IN}$ being sampled during the entire sequence of N+N1 sample periods as in a conventional over-sampling ADC with an N+N1 over-sample ratio.

The range compression signal is the additional signal necessary to perform the proposed range compression. Its value preferably is zero during the original N sample periods and $V_{RC}-V_{IN}$ during the additional N1 sample periods. Analyzing this signal in the frequency domain, it will have a DC component which creates the desired range compression effect and a series of undesirable AC components. These AC components can be eliminated by the digital filter present at the output of the over-sampling modulator. The output digital filter is an integral part of an over-sampling converter and it is necessary in order to reduce the shaped quantization noise present in the modulator output signal stream.

Thus the position of the additional N1 sampling periods with respect to the initial N sampling periods should be chosen such that the resultant AC components of the range compression signal suffer substantial attenuation when the modulator output data stream passes through the ADC digital filter.

In addition, when deciding upon the position of the additional N1 sample periods one must consider the limited dynamic range of the over-sampling modulator and avoid any non-linear behavior that may result when an external input signal near LL or UL combines with the ADC offset or gain error to produce an internal input signal outside the $LL_I$-to-$UL_I$ range.

For example an external input signal LL combined with an ADC offset error $V_{OF}$ results in an internal input signal $LL-V_{OF}<LL$. Until the first of the N1 sampling periods occurs the modulator will accumulate an out-of-range internal signal. Care must be taken that during this time the modulator remains within its linear range of operation. The N1 sample period will restore the average internal input signal within the ADC input signal range. If, as suggested previously, $V_{RC}$ is constructed in multiple successive N1 sample periods, the above dynamic range considerations should extend over the corresponding number of N1 sample periods that generate the $V_{RC}$ signal.

Figure 3:
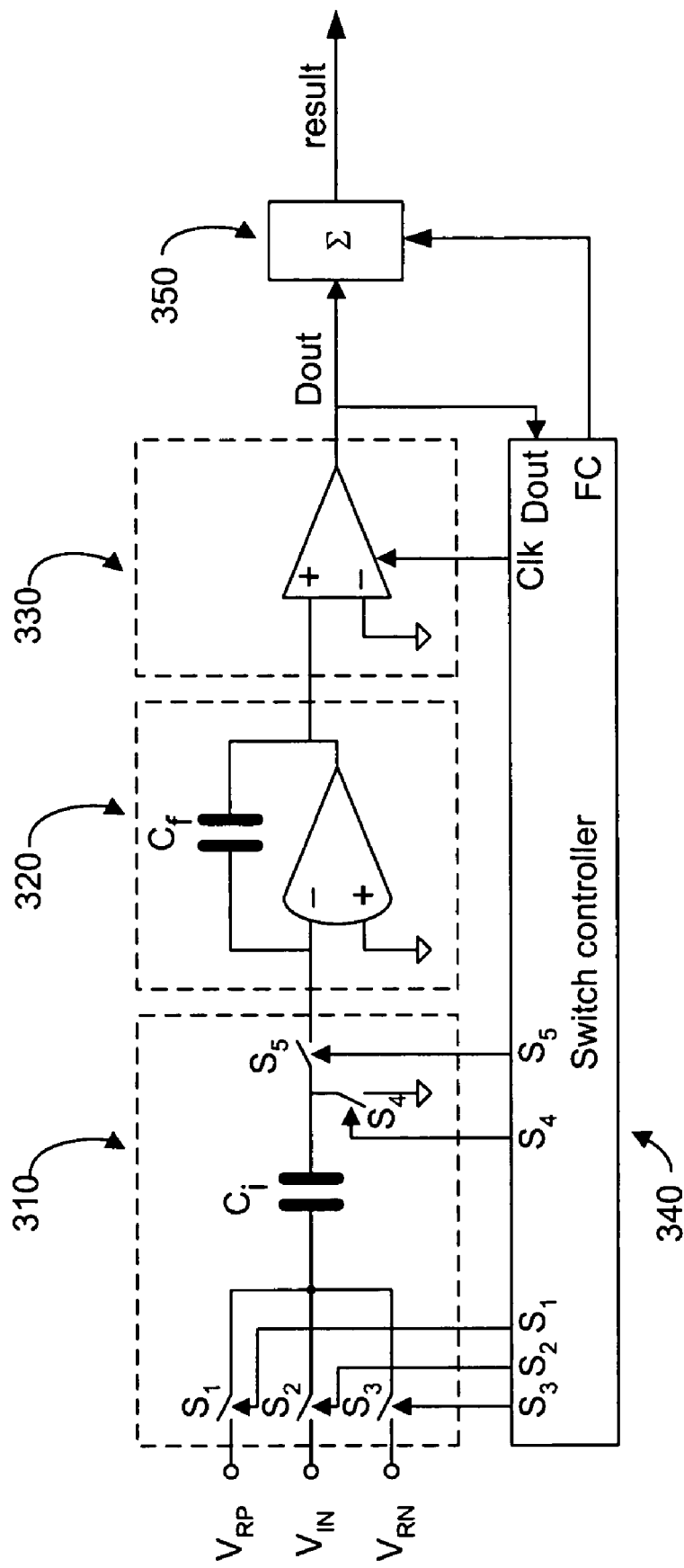
FIG. 3 is a diagram illustrating an analog-to-digital conversion arrangement according to the present invention.

An example of a practical implementation is shown in FIG. 3. For simplicity a single ended switched-capacitor implementation of a unipolar, first order, low-pass over-sampling modulator followed by a first order sinc digital filter has been chosen. The converter receives a single ended analog input signal $V_{IN}$ defined with respect to the analog reference signal $V_{RN}$ and an analog reference signal $V_{RP}$ similarly defined with respect to the analog reference signal $V_{RN}$. The converter produces the digital output "result".

The converter has a basic over-sampling ratio $N=2^{16}$ to which an additional N1 sampling phases are added in order to implement the range compression.

It includes an input sampling circuit 310, an integrator 320, an output comparator 330, a switch controller 340 and a digital filter 350.

The input sampling circuit contains input sampling capacitor $C_I$. It receives three external signals $V_{RP}$, $V_{IN}$ and $V_{RN}$ through switches S1, S2 and S3 respectively and transfers the sampled signal to integrator 320 through switch S5.

The integrator 320 accumulates the signal received from input sampling circuit 310 and drives the output comparator 330.

The output comparator 330 generates the digital output stream Dout. When the comparator 330 is triggered by the control signal Clk it produces an output digital value Dout=1 if the integrator 320 output is positive and Dout=0 if the integrator 320 output is negative. This data stream is used by the switch controller 340 together with an internal clock signal to direct the operation of this first order over-sampling modulator.

In a common over-sampling ADC configuration the output data stream Dout is subsequently processed by a digital filter which reduces the shaped quantization noise and calculates the conversion result. In this example the filter 350 is implemented as a simple digital accumulator with a $sinc^1$ frequency domain transfer function.

The switch controller 340 through the signal FC frames the operation of the filter 350. Thus the filter 350 will reset itself and accumulate the Dout data stream for N+N1 consecutive sample periods in order to produce one conversion result. Subsequently the accumulator will be reset again and the accumulation process restarted for a new conversion result.

The external input signals $V_{RP}$ and $V_{RN}$ represent the positive and negative reference voltages which define the modulator maximum external input range. Thus $LL=V_{RN}$ and $UL=V_{RP}$. The internal input range of this modulator is approximately equal to its external input range thus $LL_I \approx LL=V_{RN}$ and $UL_I \approx UL=V_{RP}$. The slight differences between these values are due to offset and gain errors produced by real life performance limitations of the circuit elements used to implement this architecture. Such factors are amplifier offset and open-loop gain, switch charge injection and signal dependent parasitic impedances.

$V_{IN}$ represents the over-sampling converter analog input signal. This over-sampling converter has an over-sampling ratio $N=2^{16}$ therefore the signal $V_{IN}$ is sampled and accumulated within the integrator 320 exactly $N=2^{16}$ times.

In order to mitigate the previously described issues it is desirable to reduce the modulator external input range LL-to-UL to an internal input range LL'-to-UL' such that:

$$LL'>LL_I \text{ and } UL'<UL_I.$$

The desired margins at the end points of the internal input range are both equal with approximately 0.048%, respectively, of full scale. Under this assumption one can choose:

$$V_{RC}=0.5*(LL+UL)=0.5*(V_{RN}+V_{RP}) \text{ and}$$
$$N1=0.001*N \approx N*2^6/2^{16}$$

Thus $N=2^{16}$ and $N1=2^6$.

Analogous to $V_{IN}$, $V_{RC}$ is also defined with respect to $V_{RN}$.

According to the previously developed relations:

$$LL'=LL+0.000488*(V_{RP}-V_{RN})>LL_I$$

$$UL'=UL-0.000488*(V_{RP}-V_{RN})<UL_I$$

The proposed range compression is implemented within the switch controller 340 which is able to initiate three types of sampling cycles labeled IN, RP and RN.

An IN-type sampling cycle is performed N times during a conversion operation and consists of sampling the analog input signal $V_{IN}$. In addition, during this cycle the modulator samples the upper reference input signal $V_{RP}$ or the lower reference input signal $V_{RN}$ depending upon the value of the Dout digital signal. In order to implement an IN-type sampling cycle the switch controller 340 preferably directs the following sequence of events:

1. Trigger the voltage comparator 330 through control signal Clk and receive digital signal Dout.
2. Open switch S5
3. Open switches S1, S2 and S3
4. Close switch S4
5. Close switch S2
6. Wait for settling of the sampled signals
7. Open switch S4
8. Open switch S2
9. Close switch S5
10. If Dout=0 close switch S3, if Dout=1 close switch S1
11. Wait for settling of the sampled signals.

An RP-type sampling cycle is performed 0.5* N1 times during a conversion operation and consists of sampling the upper reference input signal $V_{RP}$. In addition, during this cycle the modulator samples the upper reference input signal $V_{RP}$ or the lower reference input signal $V_{RN}$ depending upon the value of the Dout digital signal. In order to implement an RP-type sampling cycle the switch controller 340 directs the following sequence of events:

1. Trigger the voltage comparator 330 through control signal Clk and receive digital signal Dout.
2. Open switch S5
3. Open switches S1, S2 and S3
4. Close switch S4
5. Close switch S1
6. Wait for settling of the sampled signals
7. Open switch S4
8. Open switch S1
9. Close switch S5
10. If Dout=0 close switch S3, if Dout=1 close switch S1
11. Wait for settling of the sampled signals.

An RN-type sampling cycle is performed 0.5* N1 times during a conversion operation and consists of sampling the lower reference input signal $V_{RN}$. In addition, during this cycle the modulator samples the upper reference input signal $V_{RP}$ or the lower reference input signal $V_{RN}$ depending upon the value of the Dout digital signal. In order to implement an RN-type sampling cycle the switch controller 340 directs the following sequence of events:

1. Trigger the voltage comparator 330 through control signal Clk and receive digital signal Dout.

2. Open switch S5
3. Open switches S1, S2 and S3
4. Close switch S4
5. Close switch S3
6. Wait for settling of the sampled signals
7. Open switch S4
8. Open switch S3
9. Close switch S5
10. If Dout=0 close switch S3, if Dout=1 close switch S1
11. Wait for settling of the sampled signals.

For this specific example, as previously selected, $N=2^{16}$ and $N1=2^6$. Thus the switch controller 340 must perform $2^{16}$ IN-type sampling cycles, 32 RP-type sampling cycles and 32 RN-type sampling cycles during a complete conversion operation. The relative position of the RP and RN-type cycles within the IN-type cycles is chosen based upon previously described criteria.

A converter as shown in FIG. 3 with an original over-sampling ratio $N=2^{16}$ has an output digital range between 0 and $2^{16}-1$. As previously calculated, in order to maintain the same output range following the external input range compression, it is necessary to subtract from the accumulated result the pre-calculated output digital offset value:

$$CDO=(V_{RC}/V_{REF})*N1=0.5*N1=32.$$

Thus a digital quantity equal to CDO must be subtracted from the final result and this result must be presented with respect to the original over-sampling ratio of $N=2^{16}$. This operation can be performed by the digital filter 350. In one embodiment of the invention, at the beginning of the conversion the digital accumulator can be loaded with the $-CDO$ digital value instead of the usual reset operation.

Figure 4:
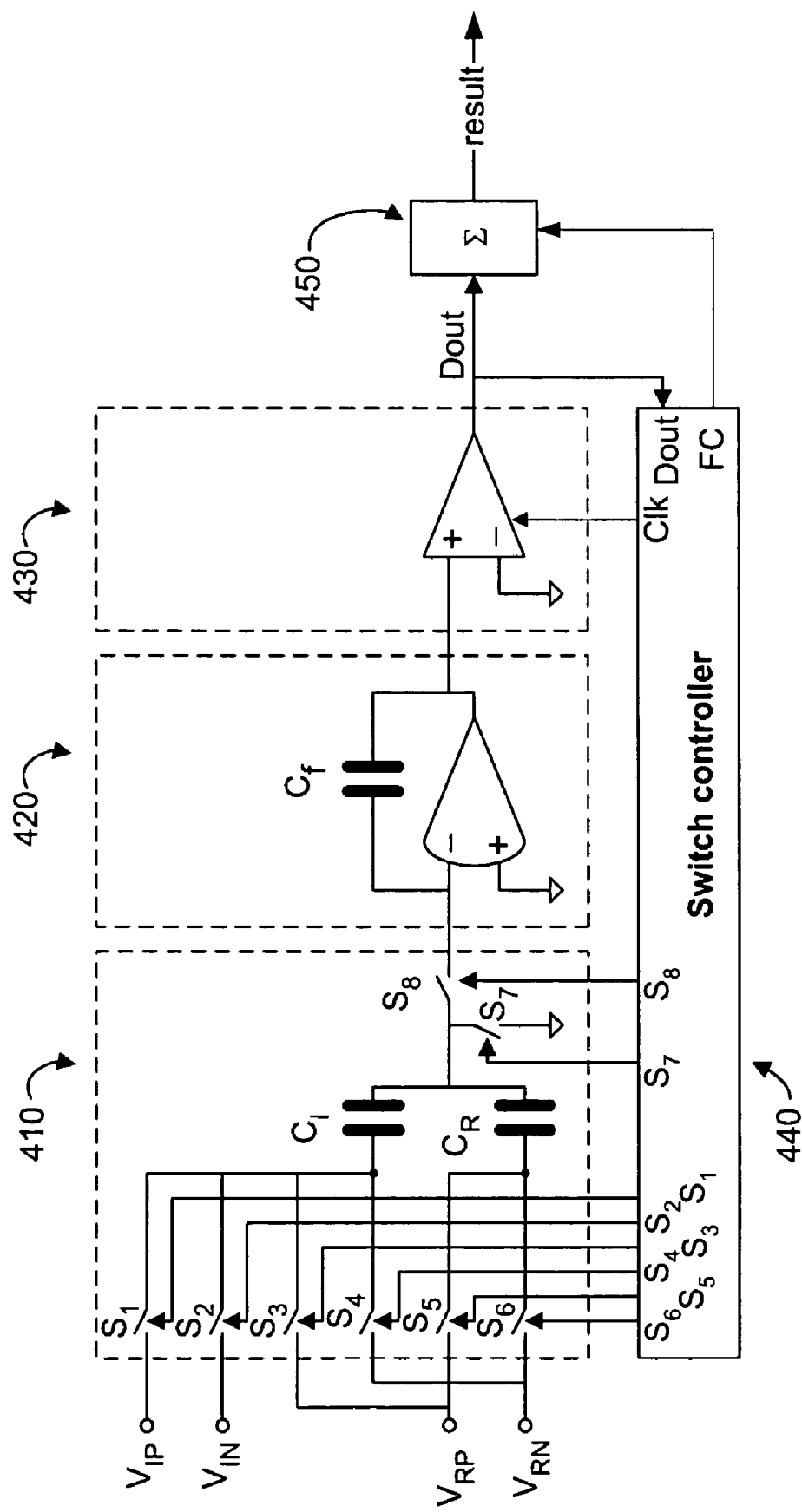
FIG. 4 is a diagram illustrating another analog-to-digital conversion arrangement for converting a differential analog signal according to the present invention.

The switch controller 340 will direct the succession of IN, RP and RN sampling cycles within one conversion operation as follows:
 a. Start the conversion operation.
 b. Set the accumulator within the digital filter 350 to initial value $-32$ and begin the accumulation of digital data Dout.
 c. Repeat 32 times the following steps 1 through 5.
  1. Perform 512 IN-type cycles
  2. Perform 1 RP-type cycle
  3. Perform 1024 IN-type cycles
  4. Perform 1 RN-type cycle
  5. Perform 512 IN-type cycles
 d. End the accumulation process in filter 350 and output the conversion result
 e. End the conversion operation Another example of a practical implementation is shown in FIG. 4. Here it is described a single ended switched-capacitor implementation of a bipolar, first order, low-pass over-sampling modulator followed by a first order sinc digital filter. The converter receives a differential analog input signal $[V_{IP}, V_{IN}]$ and a differential analog reference signal $[V_{RP}, V_{RN}]$. The converter produces the digital output "result".

The converter has a basic over-sampling ratio $N=2^{16}$ to which an additional N1 sampling phases are added in order to implement the range compression.

FIG. 4 includes an input sampling circuit 410, an integrator 420, an output comparator 430 a switch controller 440 and a digital filter 450.

The input sampling circuit contains an input sampling capacitor $C_I$ and a reference sampling capacitor $C_R$. It receives two differential signals, the input signal $[V_{IP}, V_{IN}]$ and the reference signal $[V_{RP}, V_{RN}]$. The input differential signal $[V_{IP}, V_{IN}]$ connects to the input sampling capacitor $C_I$ through switch pair S1, S2. The reference differential signal $[V_{RP}, V_{RN}]$ connects to the input sampling capacitor $C_I$ through switch pair S3, S4 and to the reference sampling capacitor $C_R$ through switch pair S5, S6. The input sampling circuit 410 transfers the sampled signal to integrator 420 through switch S8.

The integrator 420 accumulates the signal received from input sampling circuit 410 and drives the output comparator 430.

The output comparator 430 generates the digital output stream Dout. When the comparator 430 is triggered by the control signal Clk it produces an output digital value Dout=1 if the integrator 420 output is positive and Dout=0 if the integrator 420 output is negative. This data stream is used by the switch controller 440 together with an internal clock signal to direct the operation of this first order over-sampling modulator.

In a common over-sampling ADC configuration the output data stream Dout is subsequently processed by a digital filter which reduces the shaped quantization noise and calculates the conversion result. In this example the filter 450 is implemented as a simple digital accumulator with a $sinc^1$ frequency domain transfer function.

The switch controller 440 through the signal FC frames the operation of the filter 450. Thus the filter 450 will reset itself and accumulate the Dout data stream for N+N1 consecutive sample periods in order to produce one conversion result. Subsequently the accumulator will be reset again and the accumulation process restarted for a new conversion result.

The differential reference signal $[V_{RP}, V_{RN}]$ defines, through the ratio of the input sampling capacitors $C_R/C_I$, the extent of the modulator external input range.

Thus $LL=-(V_{RP}-V_{RN})*C_R/C_I$ and $UL=+(V_{RP}-V_{RN})*C_R/C_I$

The internal input range of this modulator is approximately equal to its external input range thus $LL_I \approx LL$ and $UL_I \approx UL$. The slight differences between these values are due to offset and gain errors produced by real life performance limitations of the circuit elements used to implement this architecture. Such factors are amplifier offset and open-loop gain, switch charge injection and signal dependent parasitic impedances.

$[V_{IP}, V_{IN}]$ represents the over-sampling converter differential analog input signal. This over-sampling converter has an over-sapling ratio $N=2^{16}$ therefore the signal $[V_{IP}, V_{IN}]$ is sampled and accumulated within the integrator 420 exactly $N=2^{16}$ times.

In order to mitigate the previously described issues it is desirable to reduce the modulator external input range LL-to-UL to an internal input range LL'-to-UL' such that:

$LL'>LL_I$ and $UL'<UL_I$.

The desired margins at the end points of the internal input range are both equal with approximately 0.048% of full scale. The internal full scale range (FSR) for this bipolar implementation is:

$$FSR=UL_I-LL_I \approx UL-LL=2*(V_{RP}-V_{RN})*C_R/C_I.$$

Under these assumptions one can choose:

$$V_{RC}=0.5*(LL+UL)=0 \text{ and } N1=0.001*N \approx N*2^6/2^{16}$$

Thus $N=2^{16}$ and $N1=2^6$.
According to the previously developed relations:

$$LL'=LL+0.000488*2*(V_{RP}-V_{RN})*C_R/C_I>LL_I$$

$$UL'=UL-0.000488*2*(V_{RP}-V_{RN})*C_R/C_I<UL_I$$

The proposed range compression is implemented within the switch controller 440 which is able to initiate three types of sampling cycles labeled IN, RP and RN.

An IN-type sampling cycle is performed N times during a conversion operation and consists of sampling the analog differential input signal [$V_{IP}$, $V_{IN}$] on input capacitor $C_I$. In addition, during this cycle the modulator will sample on reference capacitor $C_R$ the differential reference input signal [$V_{RP}$, $V_{RN}$] or the inverse differential reference input signal [$V_{RN}$, $V_{RP}$] depending upon the value of the Dout digital signal. In order to implement an IN-type sampling cycle the switch controller 440 will direct the following sequence of events:

1. Trigger the voltage comparator 430 through control signal Clk and receive digital signal Dout.
2. Open switch S8.
3. Open switches S1, S2, S3, S4, S5 and S6
4. Close switch S7.
5. Close switch S1. If Dout=0 close switch S5, if Dout=1 close switch S6
6. Wait for settling of the sampled signals
7. Open switch S7
8. Open switches S1, S5 and S6
9. Close switch S8
10. Close switch S2. If Dout=0 close switch S6, if Dout=1 close switch S5
11. Wait for settling of the sampled signals.

An RP-type sampling cycle is performed 0.5* N1 times during a conversion operation and consists of sampling the analog differential reference signal [$V_{RP}$, $V_{RN}$] on input capacitor $C_I$. In addition, during this cycle the modulator will sample on reference capacitor $C_R$ the differential reference input signal [$V_{RP}$, $V_{RN}$] or the inverse differential reference input signal [$V_{RN}$, $V_{RP}$] depending upon the value of the Dout digital signal. In order to implement an RP-type sampling cycle the switch controller 440 will direct the following sequence of events:

1. Trigger the voltage comparator 430 through control signal Clk and receive digital signal Dout.
2. Open switch S8
3. Open switches S1, S2, S3, S4, S5 and S6
4. Close switch S7
5. Close switch S3. If Dout=0 close switch S5, if Dout=1 close switch S6
6. Wait for settling of the sampled signals
7. Open switch S7
8. Open switches S3, S5 and S6
9. Close switch S8
10. Close switch S4. If Dout=0 close switch S6, if Dout=1 close switch S5
11. Wait for settling of the sampled signals.

An RN-type sampling cycle is performed 0.5* N1 times during a conversion operation and consists of sampling the inverse differential reference signal [$V_{RN}$, $V_{RP}$] on input capacitor $C_I$. In addition, during this cycle the modulator will sample on reference capacitor $C_R$ the differential reference input signal [$V_{RP}$, $V_{RN}$] or the inverse differential reference input signal [$V_{RN}$, $V_{RP}$] depending upon the value of the Dout digital signal. In order to implement an RN-type sampling cycle the switch controller 440 will direct the following sequence of events:

1. Trigger the voltage comparator 430 through control signal Clk and receive digital signal Dout.
2. Open switch S8
3. Open switches S1, S2, S3, S4, S5 and S6
4. Close switch S7
5. Close switch S4. If Dout=0 close switch S5, if Dout=1 close switch S6
6. Wait for settling of the sampled signals
7. Open switch S7
8. Open switches S4, S5 and S6
9. Close switch S8
10. Close switch S3. If Dout=0 close switch S6, if Dout=1 close switch S5
11. Wait for settling of the sampled signals.

For this specific example, as previously selected, N=$2^{16}$ and N1=$2^6$. Thus the switch controller 440 must perform $2^{16}$ IN-type sampling cycles, 32 RP-type sampling cycles and 32 RN-type sampling cycles during a complete conversion operation. The relative position of the RP and RN-type cycles within the IN-type cycles is chosen based upon previously described criteria A converter as shown in FIG. 4 with an original over-sampling ratio N=$2^{16}$ has an output digital range between 0 and $2^{16}$-1. As previously calculated, in order to maintain the same output range following the external input range compression, it is necessary to subtract from the accumulated result the pre-calculated output digital offset value:

$$CDO=(V_{RC}/V_{REF})*N1=0.$$

Thus no modification is necessary to the conventional digital filter 450 and its result must be presented with respect to the original over-sampling ratio of N=$2^{16}$. At the beginning of the conversion the digital accumulator should be reset to 0 as usual.

The switch controller 440 will direct the succession of IN, RP and RN sampling cycles within one conversion operation as follows:

f. Start the conversion operation.
g. Reset the accumulator within the digital filter 450 to initial value 0 and begin the accumulation of digital data Dout.
h. Repeat 32 times the following steps 1 through 5.
1. Perform 512 IN-type cycles
2. Perform 1 RP-type cycle
3. Perform 1024 IN-type cycles
4. Perform 1 RN-type cycle
5. Perform 512 IN-type cycles
i. End the accumulation process in filter 450 and output the conversion result
j. End the conversion operation It should be noted that in this implementation the range compression signal $V_{RC}$ is zero. If linearity can be traded for improved noise a simpler alternative can be considered. Such a configuration is shown in FIG. 5. The input sampling circuit 410 of FIG. 4 has been replaced with the simpler input sampling circuit 510 and the switch controller circuit 440 has been replaced by the switch controller block 540.

The input sampling circuit contains an input sampling capacitor $C_I$ and a reference sampling capacitor $C_R$. It receives two differential signals, the input signal [VIP, $V_{IN}$] and the reference signal [$V_{RP}$, $V_{RN}$]. The input differential signal [$V_{IP}$, $V_{IN}$] connects to the input sampling capacitor $C_I$ through switch pair S1, S2. The reference differential signal [$V_{RP}$, $V_{RN}$] connects to the reference sampling capacitor $C_R$ through switch pair S5, S6. The input sampling circuit 510 transfers the sampled signal to integrator 520 through switch S8.

All parameters previously calculated remain the same. The only modifications made in this simplified configuration are taking place in the definition of the RP and RN cycles.

An RP-type sampling cycle is performed 0.5* N1 times during a conversion operation and consists of a null operation on input capacitor $C_I$ (i.e. no charge is sampled on input capacitor $C_I$ during and RP-type sampling cycle). In addition, during this cycle the modulator will sample on reference capacitor $C_R$ the differential reference input signal $[V_{RP}, V_{RN}]$ or the inverse differential reference input signal $[V_{RN}, V_{RP}]$ depending upon the value of the Dout digital signal. In order to implement an RP-type sampling cycle the switch controller 510 will direct the following sequence of events:

1. Trigger the voltage comparator 530 through control signal Clk and receive digital signal Dout.
2. Open switch S8
3. Open switches S1, S2, S5 and S6
4. Close switch S7
5. If Dout=0 close switch S5, if Dout=1 close switch S6
6. Wait for settling of the sampled signals
7. Open switch S7
8. Open switches S5 and S6
9. Close switch S8
10. If Dout=0 close switch S6, if Dout=1 close switch S5
11. Wait for settling of the sampled signals.

An RN-type sampling cycle is performed 0.5* N1 times during a conversion operation and consists of a null operation on input capacitor $C_I$ (i.e. no charge is sampled on input capacitor $C_I$ during and RP-type sampling cycle). In addition, during this cycle the modulator will sample on reference capacitor $C_R$ the differential reference input signal $[V_{RP}, V_{RN}]$ or the inverse differential reference input signal $[V_{RN}, V_{RP}]$ depending upon the value of the Dout digital signal. In order to implement an RN-type sampling cycle the switch controller 510 will direct the following sequence of events:

1. Trigger the voltage comparator 530 through control signal Clk and receive digital signal Dout.
2. Open switch S8
3. Open switches S1, S2, S5 and S6
4. Close switch S7
5. If Dout=0 close switch S5, if Dout=1 close switch S6
6. Wait for settling of the sampled signals
7. Open switch S7
8. Open switches S5 and S6
9. Close switch S8
10. If Dout=0 close switch S6, if Dout=1 close switch S5
11. Wait for settling of the sampled signals.

The operation of the switch controller 540 in FIG. 5 with respect with the IN-type sampling cycle as well as with respect to the succession of IN, RP and RN-type sampling phases within a conversion process remains identical to the operation of the switch controller 440 in FIG. 4.

It will be immediately obvious to one skilled in the art that these configurations can be extended to differential implementations and to implementations using multiple sets of sampling capacitors for input range scaling, offset control or multi-bit feedback. Additionally, this invention is applicable to configurations utilizing multiple sampling capacitors in order to obtain accurate full scale performance as detailed in U.S. Pat. No. 6,140,950.

This invention is immediately applicable to higher order modulators by increasing the complexity of the integrator stage, and can be integrated with other well known oversampling converter architectures like band-pass, MASH, etc.

What is claimed is:

1. A method of deriving a compressed operational range of an analog to digital converter from an input signal range of the analog to digital converter, the relationship of the compressed operational range to the input signal range dependent on a compression factor, the method comprising:
   sampling an analog input signal N times; and
   sampling a range compression signal N1 times to obtain the compression factor, wherein the compression factor is based at least in part on the ratio of N1/(N+N1).

2. The method of claim 1 further comprising adjusting the upper limit of the compressed operational range.

3. The method of claim 1 further comprising adjusting the lower limit of the compressed operational range.

4. The method of claim 1 further comprising providing an operational range offset proportional to the range compression signal.

5. The method of claim 1 wherein the sampling of the range compression signal N1 times comprises sampling a first reference signal X times and a second reference signal Y times to form an average range compression signal that comprises a magnitude greater than the first reference signal and smaller than the second reference signal.

6. The method of claim 1 further comprising providing an indication of the output range of the analog to digital converter.

7. The method of claim 1 further comprising providing an indication of the output of the analog to digital converter that is independent of the range compression signal.

8. The method of claim 1 further comprising providing an indication of the output of the analog to digital converter that is independent of N1.

9. The method of claim 1 further comprising enabling endpoint calibration of the analog to digital converter.

10. The method of claim 1 further comprising locating the sampling of the range compression signal (N1 times) with respect to the sampling of the analog input signal (N times) to increase attenuation of AC signal components in the range compression signal.

11. An analog to digital converter having a compressed operational range derived from an input signal range, the relationship of the compressed operational range to the input signal range depending on a compression factor, the analog to digital converter being configured for:
   receiving an analog input signal;
   receiving a first reference signal;
   receiving a second reference signal; and
   including circuitry for deriving from the first and second reference signals, a range compression signal variable having a magnitude greater than the first reference signal and smaller than the second reference signal wherein, when the analog input signal is sampled N times and the range compression signal variable is sampled N1 times, a compression factor is obtained, wherein the compression factor is based at least in part on the ratio of N1/(N+N1).

12. The converter of claim 11 wherein the range compression signal variable is an average range compression signal variable that is formed by sampling the first reference signal X times and the second reference signal Y times.

13. The converter of claim 11 wherein the circuitry is configured to be controllable for providing an output range of the analog to digital converter.

14. The converter of claim 11 wherein the circuitry is configured to be controllable for providing an output range of the analog to digital converter that is independent of the range compression signal variable.

15. The converter of claim 11 wherein the circuitry is configured to be controllable for providing an output range of the analog to digital converter that is independent of N1.

16. The converter of claim 11 wherein the sampling of the range compression signal variable enables endpoint calibration of the analog to digital converter.

17. The converter of claim 11 wherein the sampling of the range compression signal variable (N1 times) is located with respect to the sampling of the analog input signal (N times) to increase attenuation of AC signal components in the range compression signal variable.

18. The converter of claim 11 wherein the circuitry is further configured for expanding an operational range of the analog to digital converter to obtain an analog signal output range.

19. An analog to digital converter configured for:
receiving first and second reference signals; and
including circuitry for sampling the first and second reference signals to form an average compressed operational signal variable in order to provide a compressed operational signal range of a magnitude that is less than a magnitude of an external input range and less than a magnitude of an internal input range.

20. The converter of claim 19, wherein
the average compressed operational signal variable is formed by sampling the first reference signal X times and the second reference signal Y times.

21. The converter of claim 19 wherein the internal input range is substantially equivalent to the external input range.

22. The converter of claim 19 wherein the compressed operational signal range comprises an adjustable upper limit.

23. The converter of claim 19 wherein the compressed operational signal range comprises an adjustable lower limit.

24. The converter of claim 19 wherein the compressed operational signal range comprises an adjustable compression factor resolution.

25. The converter of claim 19 wherein the compressed operational signal range is indiscernible from the internal input range and the external input range.

26. The converter of claim 19 wherein the compressed operational signal range enables endpoint calibration of the analog to digital converter.

27. An analog to digital converter comprising:
circuitry configured for providing a compressed operational signal range of a magnitude that is less than a magnitude of the external input range and less than a magnitude of the internal input range, the circuitry being controllable for increasing attenuation of AC signal components obtained as a result of compression of the formation of the compressed operational signal range.

28. The converter of claim 19 wherein the circuitry is further configured to be controllable for an output code range that is independent of the magnitude of the compressed operational signal range.

29. Circuitry for deriving a compressed operational range of an analog to digital converter from an input signal range of the converter, the relationship of the compressed operational range to the input signal range dependent on a compression factor, the circuitry being configured to be controllable for:
sampling an analog input signal N times; and
sampling a range compression signal variable N1 times to obtain the compression factor, wherein
the compression factor is based at least in part on the ratio of $N1/(N+N1)$.

30. The circuitry of claim 29, wherein the circuitry is further configured to be controllable for adjusting the upper limit of the compressed operational range.

31. The circuitry of claim 29, wherein the circuitry is further configured to be controllable for adjusting the lower limit of the compressed operational range.

32. The circuitry of claim 29, wherein the circuitry is further configured to be controllable for providing an operational range offset proportional to the range compression signal variable.

33. The circuitry of claim 29, wherein the sampling of the range compression signal variable N1 times comprises sampling a first reference signal X times and a second reference signal Y times to form an average range compression signal variable of a magnitude greater than the first reference signal and smaller than the second reference signal.

34. The circuitry of claim 29, wherein the circuitry is further configured to be controllable for providing the output range of the analog to digital converter.

35. The circuitry of claim 29, wherein the circuitry is further configured to be controllable for providing the output of the analog to digital converter that is independent of the range compression signal variable.

36. The circuitry of claim 29, wherein the circuitry is further configured to be controllable for providing the output of the analog to digital converter that is independent of N1.

37. The circuitry of claim 29, wherein the circuitry is further configured to be controllable for enabling endpoint calibration of the analog to digital converter.

38. The circuitry of claim 29, wherein the circuitry is further configured to be controllable for locating the sampling of the range compression signal variable (N1 times) with respect to the sampling of the analog input signal (N times) to increase attenuation of AC signal components in the range compression signal variable.

* * * * *